United States Patent
Leijten (10) Patent No.: US 7,308,540 B2
(45) Date of Patent: Dec. 11, 2007

(54) PSEUDO MULTIPORT DATA MEMORY HAS STALL FACILITY

(75) Inventor: Jeroen Anton Johan Leijten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 143 days.

(21) Appl. No.: 10/515,453

(22) PCT Filed: May 22, 2003

(86) PCT No.: PCT/IB03/02221

§ 371 (c)(1),
(2), (4) Date: Nov. 22, 2004

(87) PCT Pub. No.: WO03/100549

PCT Pub. Date: Dec. 4, 2003

(65) Prior Publication Data

US 2005/0166021 A1    Jul. 28, 2005

(30) Foreign Application Priority Data

May 24, 2002  (EP) .................................. 02077042

(51) Int. Cl.
*G06F 12/00*  (2006.01)
(52) U.S. Cl. ...................... 711/149; 710/242
(58) Field of Classification Search ................ 711/149
See application file for complete search history.

(56) References Cited

U.S. PATENT DOCUMENTS

| | | | | |
|---|---|---|---|---|
| 5,412,788 A * | 5/1995 | Collins et al. | ............... | 711/157 |
| 5,559,970 A | 9/1996 | Sharma | | |
| 5,659,711 A * | 8/1997 | Sugita | ......................... | 711/144 |
| 6,006,296 A * | 12/1999 | Gold et al. | .................. | 710/100 |
| 6,081,883 A * | 6/2000 | Popelka et al. | ................ | 712/28 |
| 6,393,512 B1 * | 5/2002 | Chen et al. | ..................... | 711/5 |
| 6,880,031 B2 * | 4/2005 | Singh et al. | ................. | 710/305 |
| 2003/0196058 A1 * | 10/2003 | Ramagopal et al. | ......... | 711/169 |

\* cited by examiner

*Primary Examiner*—Brian R. Peugh
*Assistant Examiner*—Hashem Farrokh
(74) *Attorney, Agent, or Firm*—Leydig, Voit & Mayer Ltd.

(57) ABSTRACT

A computer memory arrangement comprises a first plurality of input port facilities that are collectively coupled through a first router facility to selectively feed a first plurality of memory modules. It furthermore includes an output port facility that is fed collectively by the first plurality of memory modules. further ,the computer memory arrangement includes an access detection facility for detecting simultaneous and conflicting accesses occurring through more than one of the first plurality of input port facilities for a particular memory,module, and for thereupon allowing only a single one among the simultaneous and conflicting accesses while generating a stall signal for signaling a mandatory stall signal to any request source pertaining to another request.

16 Claims, 12 Drawing Sheets

PSEUDO MULTIPORT DATA MEMORY HAS STALL FACILITY

BACKGROUND OF THE INVENTION

The invention relates to a computer memory arrangement, comprising a first plurality of input ports that are collectively coupled through a first router facility to selectively feed a second plurality of memory modules as has furthermore been recited in the present system. Present-day computing facilities such as Digital Signal Processors (DSP) require both a great processing power, and also much communication traffic between memory and processor(s). Furthermore, ideally, both of the performance aspects associated to the numbers of memory modules and processors, respectively, should be scalable, and in particular, the number of parallel data moves should be allowed to exceed the value of 2.

As long as a scale of 2 were sufficient, a possible solution would be to have two fully separate and fully functional memories, but then the selecting for a storage location between the two memories represents a complex task. Obviously, the problem will be aggravated for scale factors that are higher than 2. Moreover, the programs that will handle such separate storage facilities will often fall short in portability, such as when they have been realized in the computer language C. Therefore, in general a solution with a "unified memory map" will be preferred. In practice, each memory access is then allowed to refer to any arbitrary address.

A realization of the above arrangement with two-port memories is quite feasible per se, but extension of the number of ports above two is generally considered too expensive. Therefore, the providing of specific hardware configurations on the level of the memory proper is considered inappropriate.

SUMMARY TO THE INVENTION

In consequence, amongst other things, it is an object of the present invention to provide a solution that is generally based on one-port memories which collectively use a unified memory map, and wherein conflicts between respective accesses are accepted, but wherein the adverse effects thereof are minimized through allowing to raise the latency of the various accesses. Therefore, the solution according to the present invention is based on providing specific facilities as peripherals to the memory banks proper.

Now therefore, according to one of its aspects the invention is characterized according to the characterizing part of the present system.

The invention also relates to a computer arrangement comprising a fourth plurality of load/store units interfaced to a memory arrangement as in the present system. Further advantageous aspects of the invention are recited herein.

BRIEF DESCRIPTION OF THE DRAWING

These and further aspects and advantages of the invention will be discussed more in detail hereinafter with reference to the disclosure of preferred embodiments, and in particular with reference to the appended Figures that show.

DETAILED DESCRIPTION OF PREFERRED EMBODIMENTS

Figure 1:
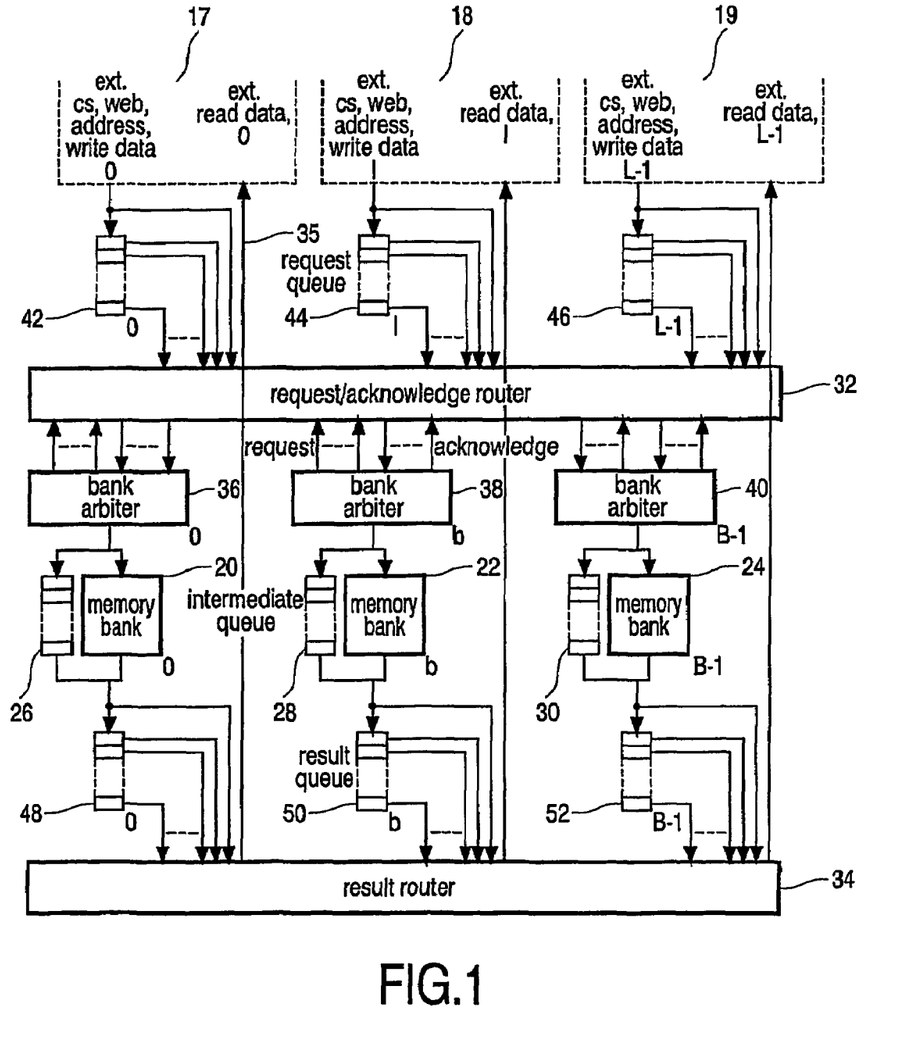
FIG. 1, a pseudo multiport data memory template or parametrizable embodiment.

FIG. 1 illustrates a pseudo multiport data memory template or parametrizable embodiment. The template consists of an exemplary number of L building blocks (only the numbers 0, 1, L-1 having been shown) that surround an array of B memory banks 20-24 (only the numbers 0, b, and B-1 having been shown), each provided with an intermediate queue 26-30 that has been put in parallel between the input and the output of the memory module in question. The memory banks represent a unified address map. Generally, the values relate according to $B \geq L$, but this is no restriction and in principle, the value of B may be as low as 1.

The external access signals may as shown at the top of the Figure, emanate from respecive load/store unit facilites 17-19. Each access signal comprises a chip select cs, a write enable web, and each will furthermore present an address and write data. These signals will be sent to request/acknowledge router 32. In general, each external access facility will also be able to receive external read data, as shown by the arrows such as arrow 35 from result router 34. The purposes of the blocks surrounding the memory banks are threefold. First, the access requests to the various memory banks are routed by router facility 32 from the appropriate write port to the correct memory bank, and furthermore, the access results from the various memory banks are routed back by router facility 34 from the appropriate memory bank towards the correct read port.

Second, in the case of multiple access requests referring to the same memory bank in the same cycle, the obvious conflict will have to be resolved. To this effect, each memory bank 20-24 has a dedicated bank arbiter 36-40 located in front thereof.

Third, the number of bank conflicts is reduced by extending the latency of the bank accesses by an additional slack interval above the unavoidable access latency that is associated to the memory banks proper. The additional slack is obtained through delaying the accesses in L parallel request queues 42-46, wherein L is the number of read/write ports, and furthermore through delaying the results in B parallel result queues 48-52, wherein B is the number of memory banks.

The request queues 42-46 may delay input requests over a time as depending on the circumstances. A supplemental delay in the result queues 48-52 may produce an overall delay between the actual request and the instant that the result becomes available at the output port, wherein the overall delay has a uniform value. This latter feature implies that the compiler may take this uniform delay value into account when scheduling the program. The various building blocks may operate as discussed hereinafter more extensively. As shown in the embodiment, the request queues and result queues operate on the basis of serial-in-parallel-out, but this is no explicit restriction. Finally as shown, each memory bank 20-24 has a respectively associated intermediate queue 26-30 to be further discussed hereinafter.

Figure 2:
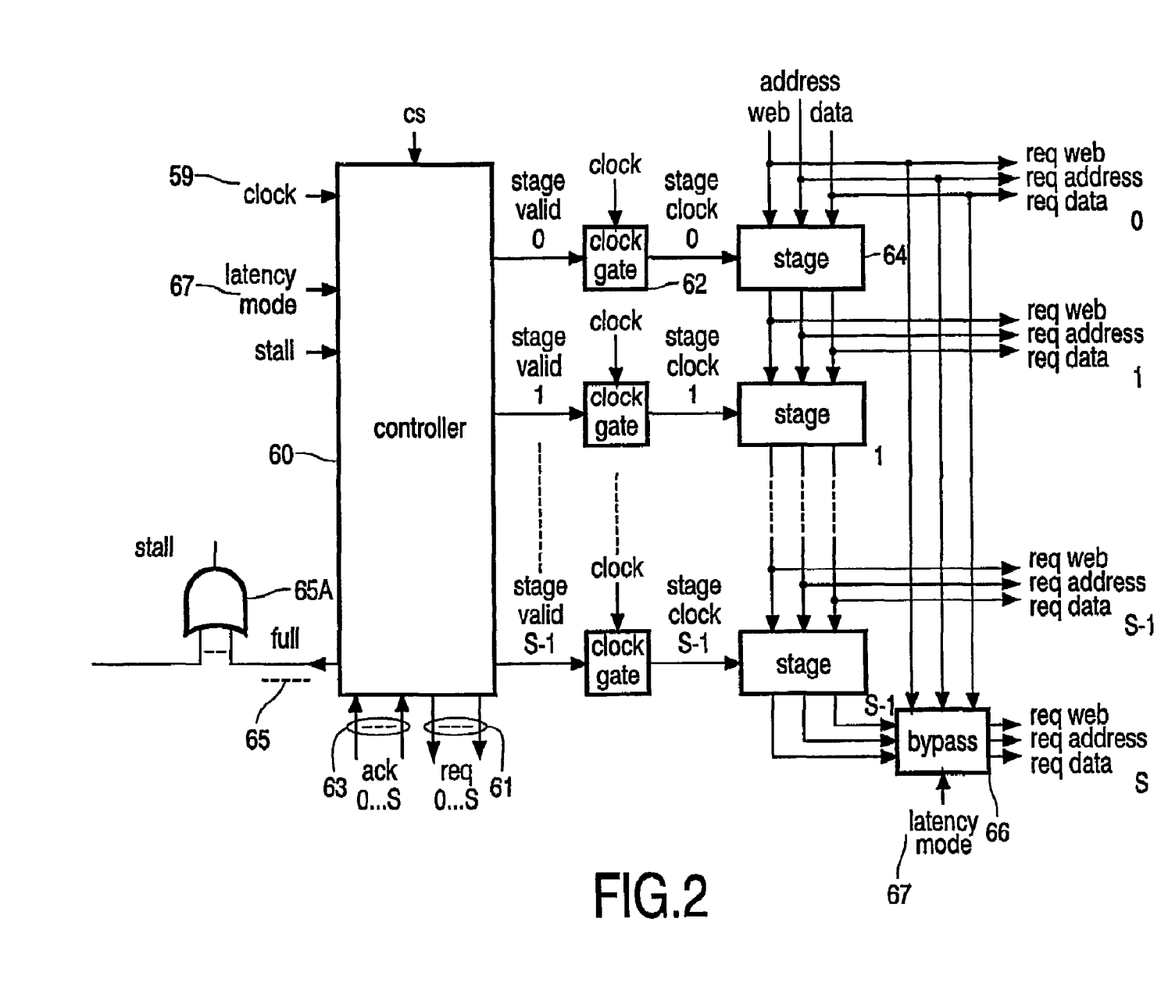
FIG. 2, a request queue embodiment.

FIG. 2 illustrates a request queue embodiment, wherein for clarity among a plurality of corresponding items only a single one has been labeled by a reference numeral. The arrangement as shown has a single controller 60 and a plurality of delay stages 64 equal to the length of the slack S measured in clock cycles. The controller 60 receives the master clock signal 59, and is therefore continuously active, and furthermore the signals chip select and stall. It produces S stage valid flags 0 . . . S-1 that control respective clock gates 62. A stage such as stage 64 is only active with valid data therein, thereby avoiding to spend power on invalid data. The signals cs, web, address, and data have been shown as in FIG. 1. A request that cannot be handled immediately is queued in the request queue. From every request queue stage 64, a memory bank request signal 61 may be outputted in parallel. Request priority generally follows seniority (FIFO). Requests granted get a corresponding acknowledgement signal 63 and are thereupon removed from the queue. Such acknowledgement signals can arrive for each stage separately, inasmuch as such acknowledgements may in parallel originate from respective different memory banks.

If a request has traveled through all of the queue and arrives at the bottom of the queue (stage S-1), the flag signal full 65 is raised, which implies that the request cannot be handled in the standard interval recognized by the load/store latency. Such full state will then cause a stall cycle to the requesting facilities to allow resolving the bottleneck, whilst maintaining the existing processor cycle without further advancing. The bypass facility 66 will be discussed hereinafter. The signals full from the respective request controllers 60 are ORED in OR gate 65A, the output thereof representing the stall signal for the complete arrangement of load/store facilities 17-19. Although not shown in particular in the figure, this stall signal will then be sent to all of the relevant load/store units 17-19 in FIG. 1.

Figure 3:
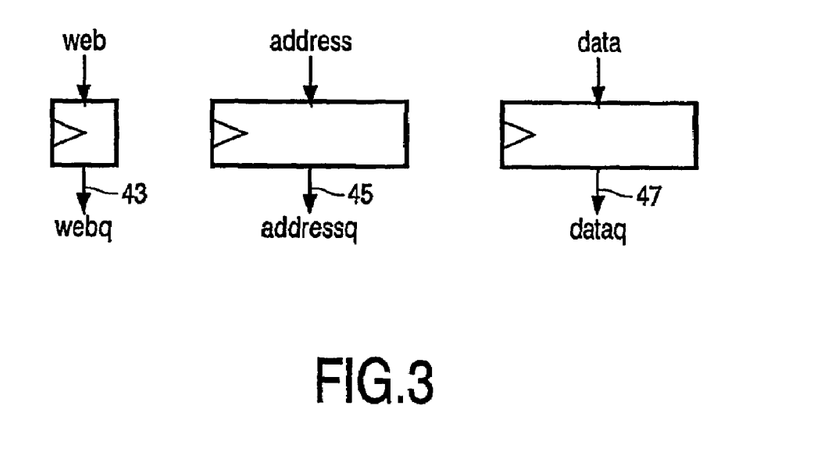
FIG. 3, a request queue stage.

FIG. 3 illustrates a request queue stage which generally corresponds to a shift register stage, allowing to store the quantities web 43, address 45, and data 47. Load/store operations have not been shown in particular in this Figure. In general they can be effected in either of two modes. In the short latency mode, load/store operations will only experience the intrinsic memory latency L1 of the memory that may, for example, be an SRAM. Then, each memory bank conflict will result in a stall cycle. In the long latency mode however, a slack interval S is added to memory latency L1, so that load/store operations will experience an overall latency of (S+L1). The request queue embodiment selectively supports both latency modes by using a special bypass block 66. In the short latency mode, this block will be used to bypass all stages 64, thereby assigning to the actually incoming request the highest priority, whilst disabling all others. The associated latency mode signal has been labeled 67.

Figure 4:
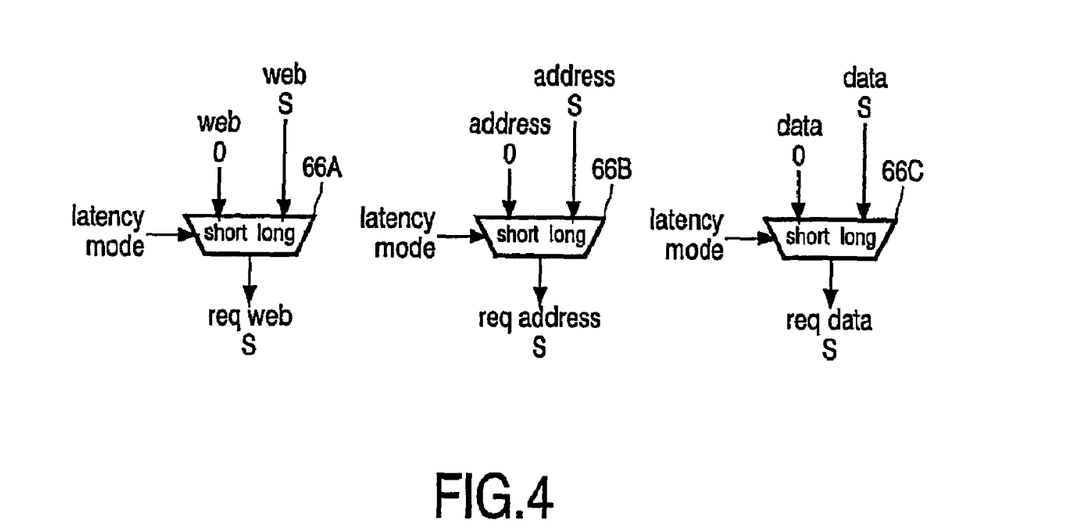
FIG. 4, a request queue bypass embodiment.

FIG. 4 illustrates a request queue bypass embodiment. It has been constructed from a set of multiplexers 66A, 66B, 66C, that will collectively select either the latest incoming request, or the request that is leaving the final queue stage S-1. The actually selected request will have the highest priority.

Figure 5:
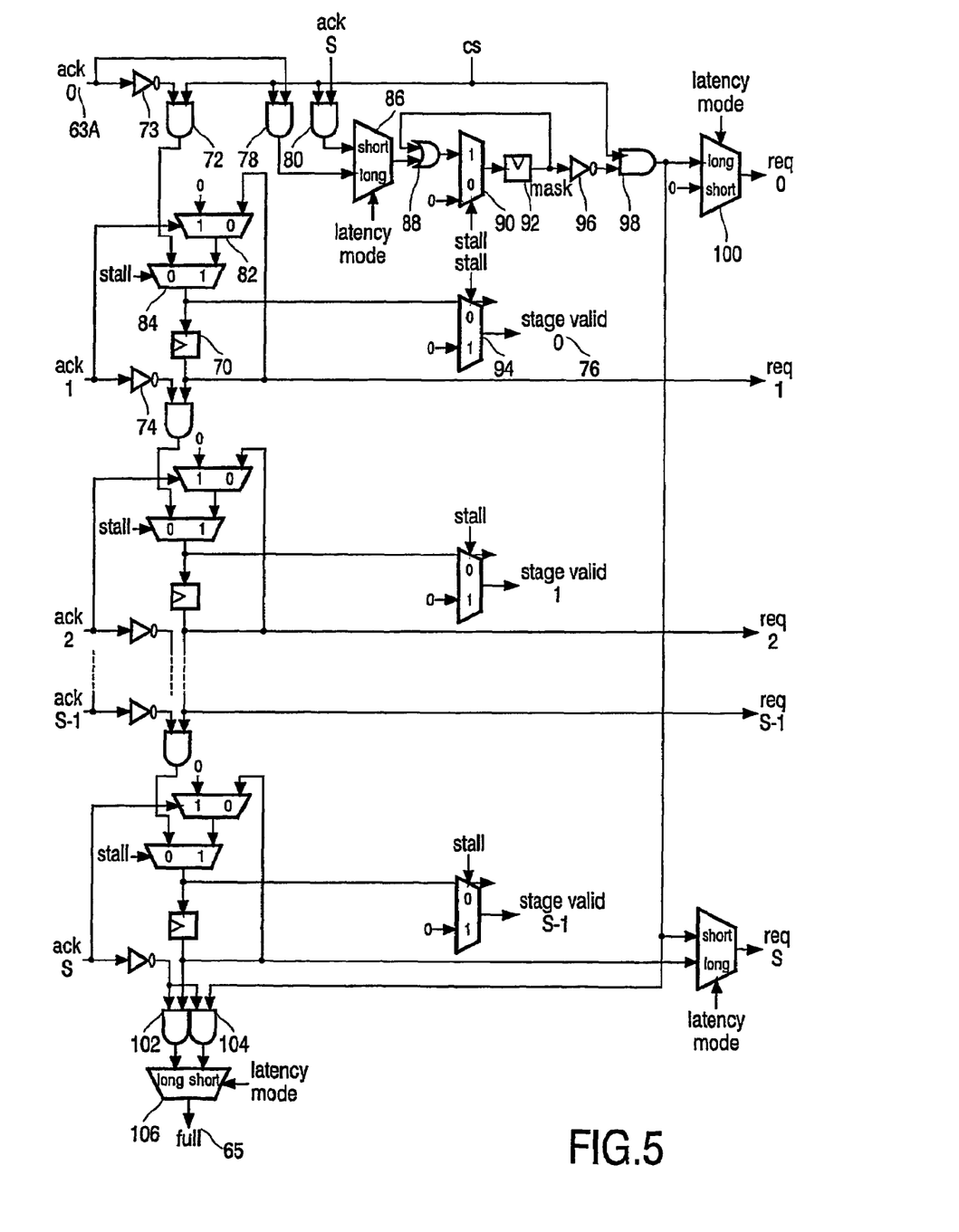
FIG. 5, a request queue controller embodiment.

FIG. 5 illustrates a request queue controller embodiment, for realizing block 60 in FIG. 2. For brevity, only the various logic elements pertaining to the uppermost stage have been labeled. Acknowledge signal ack 0 arrives at top left and feeds AND gate 78, as well as after inversion in element 73, AND gate 72. The chip select cs signal feeds AND gates 72, 78, and 80, the latter furthermore receiving acknowledge signal ack S. The latter two AND gates feed selector 86, that is controlled by the long/short latency mode signal to select the input signal as indicated. The transmitted signal enters OR gate 88, and is selectively transmitted through selector 90, that is controlled by the stall signal as shown. The signal transferred is latched in latch 92, to operate as mask signal. The mask signal is furthermore retrocoupled to OR gate 88. Next, the mask signal is inverted in inverter 96 and then fed to clocked AND gate 98. The output of AND gate 98 is fed to selector 100 which is controlled by the latency mode signal, so that the output of selector 100 will be either 0, or equal to the output signal of clocked AND gate 98.

On the left hand side of the arrangement, the inverted acknowledge ack 0 signal will be clocked to selector 84 that is controlled by the stall signal. The signal selected is fed to selector 94 that on its other input receives a 0 signal and is itself controlled by the stall signal, to on its output generating the stage valid signal 76, cf. FIG. 2. Furthermore, the output of selector 84 will be fed to latch 70. The latch content represents the request signal req 1, and is furthermore retrocoupled to selector 82 which on its other input receives a zero (0), and which selector is controlled by the signal ack 1 from the next lower stage.

For the other stages, generally the items corresponding to items 70, 72, 73, 82, 84, and 94 will be present. Now, the chip select value cs travels through a dedicated one-bit shift register with stages like stage 70, which register thus contains all pending requests. Furthermore, a received acknowledgement signal like signal 63A will clear the chip select signal cs at the stage in question through inverting an input to an AND gate like 72. Furthermore, from every chip select pipeline stage a valid flag like flag 76 is derived that drives the associated clock gate 62 in FIG. 2. The register will keep shifting as long as no memory bank conflicts will occur in the memory, that is, as long as no request queue gets full. (65) A conflict will however automatically cause a stall cycle, that stops the shifting of the queue. While the queue remains stalled, memory bank conflicts may get resolved, which means that actual requests will still be acknowledged. Hence, the clearing of acknowledged requests will continue during the stall interval.

Note that the final stage S has the request controlled in an inverse manner with respect to the other stages. Furthermore, the final stage S comprises AND gate 102 that corresponds to AND gates 72 of earlier stages, and also a second AND gate 104 that receives the inverted value of acknowledge signal ack S, and furthermore the inverted mask signal from latch 92. The two AND gates feed a selector 106 that is controlled by the latency mode control signal and transmits the full signal. When a request that had caused a queue to raise its full flag is acknowledged in this manner (without occurrence of a further full signal), the stalling signal from OR 65A is automatically terminated.

Furthermore, in the request queue facility, a bypass element 66 controlled by the latency mode signal 67 is also visible. As can be seen in FIG. 2, in the short latency mode, the entire queue will be bypassed, to assign the highest priority to the latest incoming request, whilst coincidently therewith, blocking all other requests. In the long latency mode, the seniority among the requests will generally prevail. The latency mode signal 67 may be given by an operator and/or by the system, such as being based on statistical and/or dynamic data. A longer latency, even caused by only a single stage, will dramatically decrease the number of conflicts, and thereby, the number of delaying stalls. However, a longer latency will also present a longer delay. The system should be controlled by the best trade-off that were relevant for the application or application interval in question.

Figure 6:
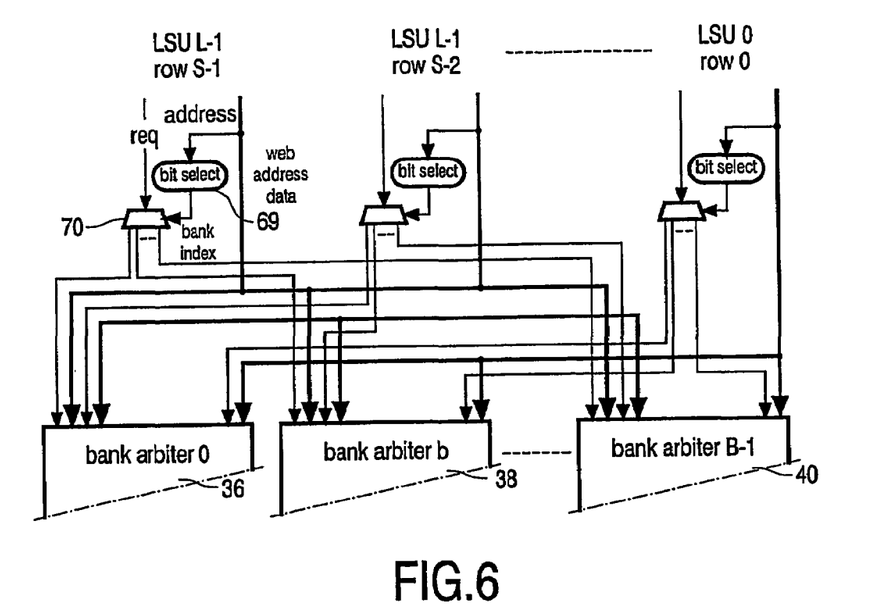
FIG. 6, a request routing facility from the request queues to the memory bank arbiters.

FIG. 6 illustrates a request routing facility from the request queues to the memory bank arbiters. This combinatory network routes all requests from all request queues to the appropriate memory bank arbiter (36-40 in FIG. 1), and would route acknowledgements pertaining to these requests back to the associated request queue, the latter not having been shown in FIG. 6. Since the memory map is uniformly interleaved over the various memory banks, the specific bank in question is determined as based on examining the least significant bits associated with the relevant access request signals. The latter is effected by bit select items like 69. The result of this bit select operation controls a demultiplexer-like item 70 that will in consequence route a one-bit request flag to the intended memory bank arbiter such as items 36-40. The components web, address, and data of the request are directly forwarded to all bank arbiters in parallel on an interconnection shown in bold representation. The total number of request lines arriving at every bank arbiter then equals the number of request queues times the maximum number of requests generated by each request queue. With a slack S, this number is (S+1)*L.

Figure 7:
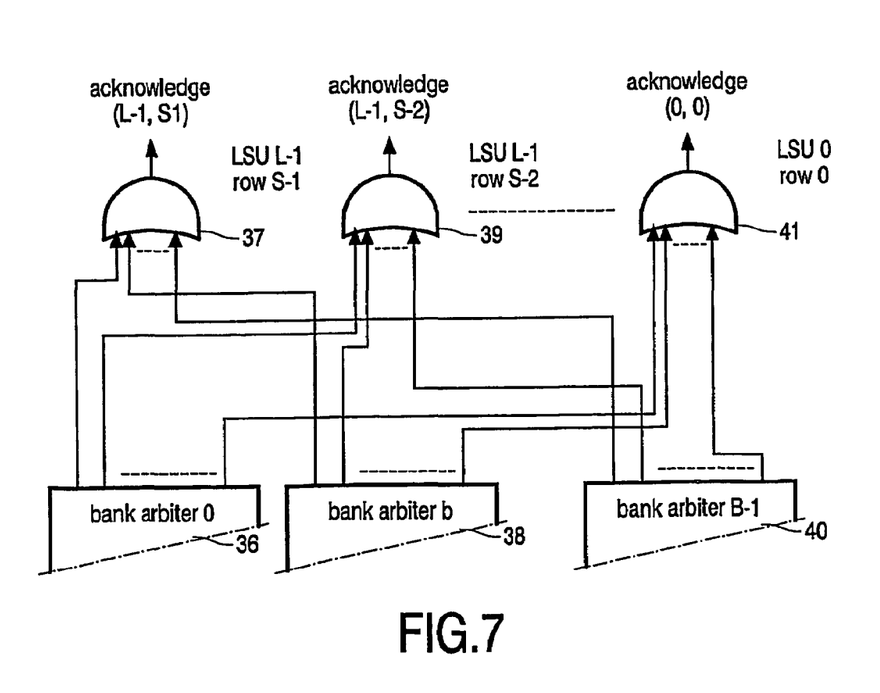
FIG. 7, an acknowledgement routing facility from the memory bank arbiters to the request queues.

Furthermore, since a request is always directed to one single bank, each request may only be acknowledged by one single bank arbiter. Therefore, for each particular request, an ORING in elements 37, 39, 41 of all corresponding acknowledge flags from the respective arbiters 36-40 will yield the associated acknowledge value. FIG. 7 illustrates this acknowledgement routing facility from the various memory bank arbiters to the pertinent request queues.

Figure 8:
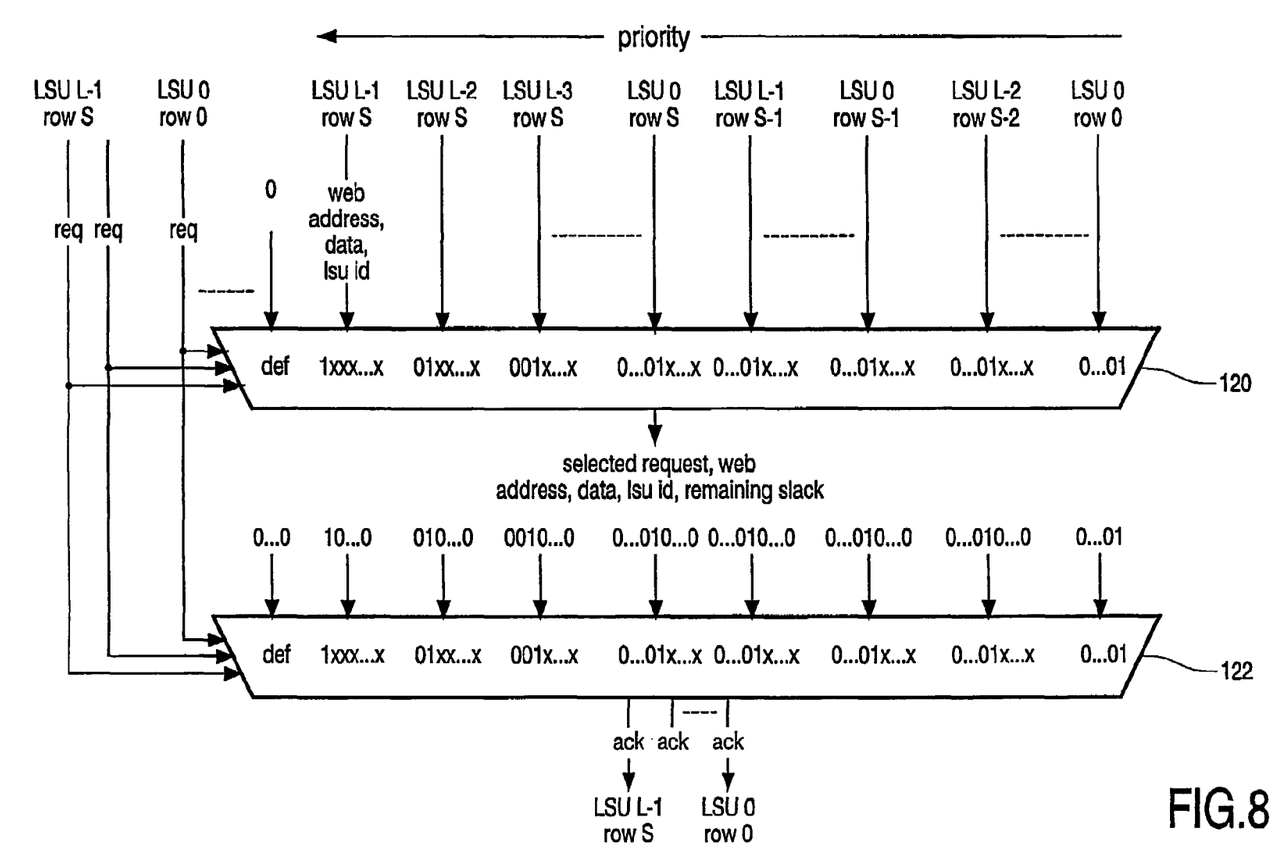
FIG. 8, a bank arbiter embodiment.

FIG. 8 illustrates a bank arbiter embodiment. The bank arbiter is operative for selecting the highest priority request presented to its input, for acknowledging this request, and for forwarding the information associated with the request to the memory bank in question. For this purpose, the incoming request flags are considered as a sorted bit vector with the relatively higher priority request flags as most significant bits, and the relatively lower priority request flags as least significant bits. The arbiter will search for the bit with the highest significance level in this vector that is "1". This bit corresponds to the valid request with the highest priority. The index of the bit in question is used to select the request that must be acknowledged. It also indicates the load/store unit from which the request is coming. This latter information will send load data for a read access back to the proper load/store unit. To have this information available at the instant on which the loaded data is available for reading, the index is sent to the intermediate queue, through which it travels to stay in synchronism with the data to be read from the addressed memory bank.

To this effect, the arbiter facility comprises selector facilities like 120 and 122. Selector facility 120 is controlled at the left side by the various requests ranging from (LSU L−1, row S), to (LSU 0, row 0). Furthermore, the selector facility 120 receives at the upper side the web, address, data, abd lsu id signals, and furthermore a signal def, or 0. As shown, the priorities have a leading string of 0, . . . zeroes, then a first "1" at mutually exclusive positions, followed by string that may have any appropriate value. The selector will output the selected request, web, address, data, lsu id, and remaining slack signals.

A second selector facility 122 is controlled by the same control signals at the left hand side as earlier, and receives at the various top bit strings with a single "1" at mutually exclusive positions, and furthermore exclusively zeroes. The selector will output acknowledge signals ranging from (LSU L−1, row S), to (LSU 0, row 0).

Figure 9:
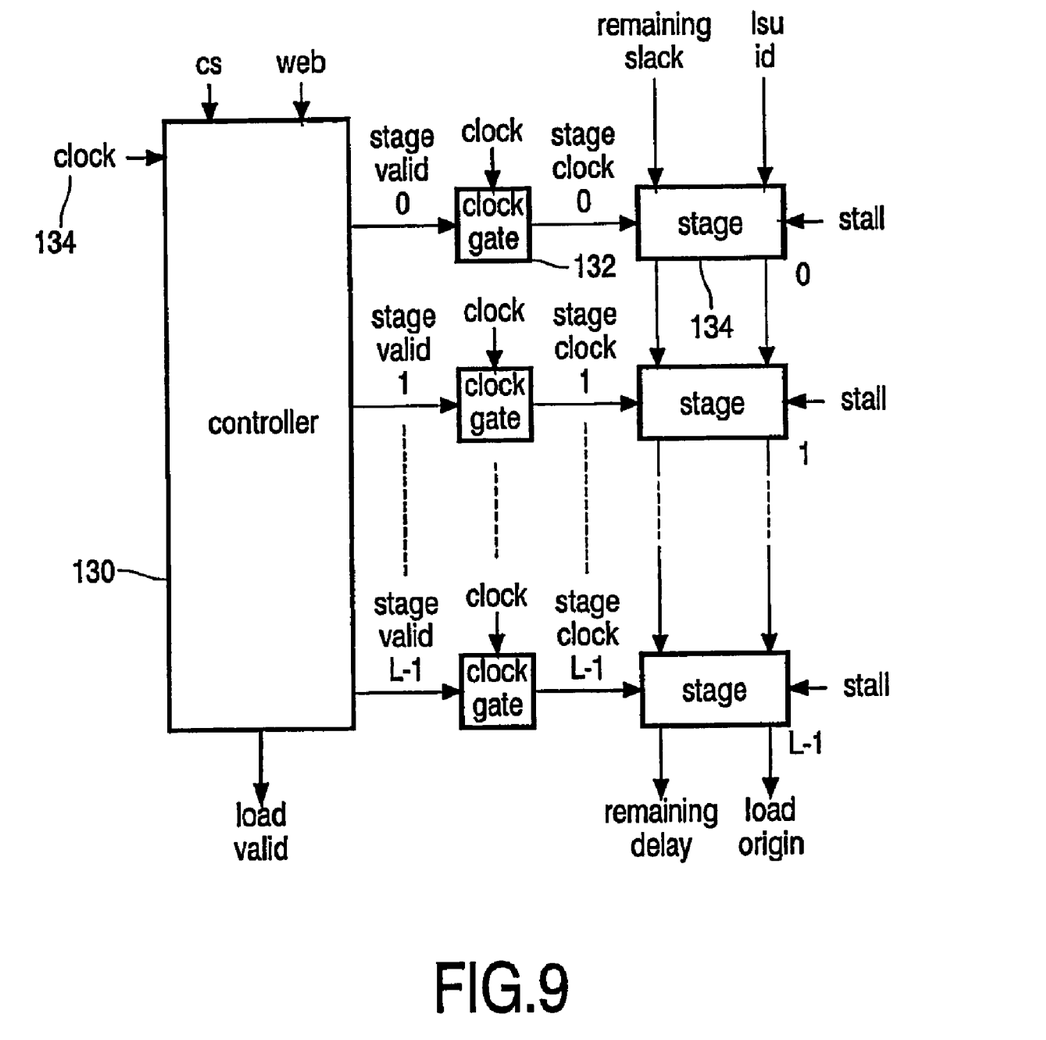
FIG. 9, an intermediate queue embodiment.

The selecting operation of the most significant bit from a bit vector can be viewed as a large multiplexer which takes the bit vector as control input, and which selects ports on the basis of the value of the Most Significant Bits MSB. In this context, FIG. 9 illustrates an intermediate queue embodiment. The intermediate queue is therefore used as a delay line for synchronizing the information pertaining to a load access during the interval in which the actual SRAM in the data memory is accessed. It consists of a single controller 130 and a number of stages such as stage 134, the number thereof being equal to the latency L1 of the SRAM. The controller is clocked by the master clock 134 and will therefore always be active: it will produce a number of L1 stage valid flags that control one clock gate such as gate 132 for each stage. As a result, a particular stage will only be active when valid data are present in that stage. No power consumption is wasted on the storing of invalid data. All of the signals chip select (cs), write enable (web), address, and data will enter the intermediate queue at its top end. Only information pertaining to load requests is stored in the queue. The final output result includes as shown a signal load valid, a signal remaining delay, and a signal load origin.

Figure 10:
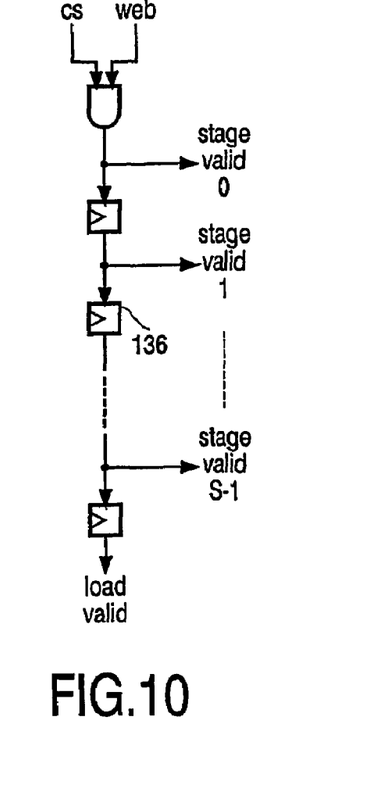
FIG. 10, an intermediate queue controller embodiment.

FIG. 10 illustrates an intermediate queue controller embodiment. It consists of a single-bit-wide delay line with stages like latch 136, which is serially fed by the signals cs and web, and which holds the valid flags for the various stages. Each such flag signifies a load operation and is created by ANDING the chip select and low-active write enable input signals. The serial output signal is load valid.

Figure 11:
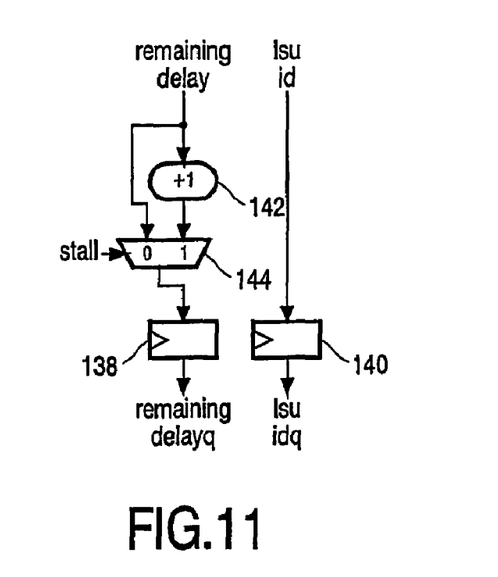
FIG. 11, an intermediate queue stage.

FIG. 11 illustrates an intermediate queue stage. Each stage has two registers, a first one (140) for holding an identifier to identify the load/store unit that issued the load request, and another one (138) to hold the remaining delay value, thereby indicating how much slack the request still will have to undergo in the data memory to meet the intended load/store latency interval. If a conflict occurs in the memory that leads to a processor stall, processor cycle time will be halted. To keep the remaining delay value consistent with processor cycle time, the value in this case will be incremented in incrementing element 142; the pertinent selection is executed through selector 144 that is controlled by the stall signal.

Figure 12:
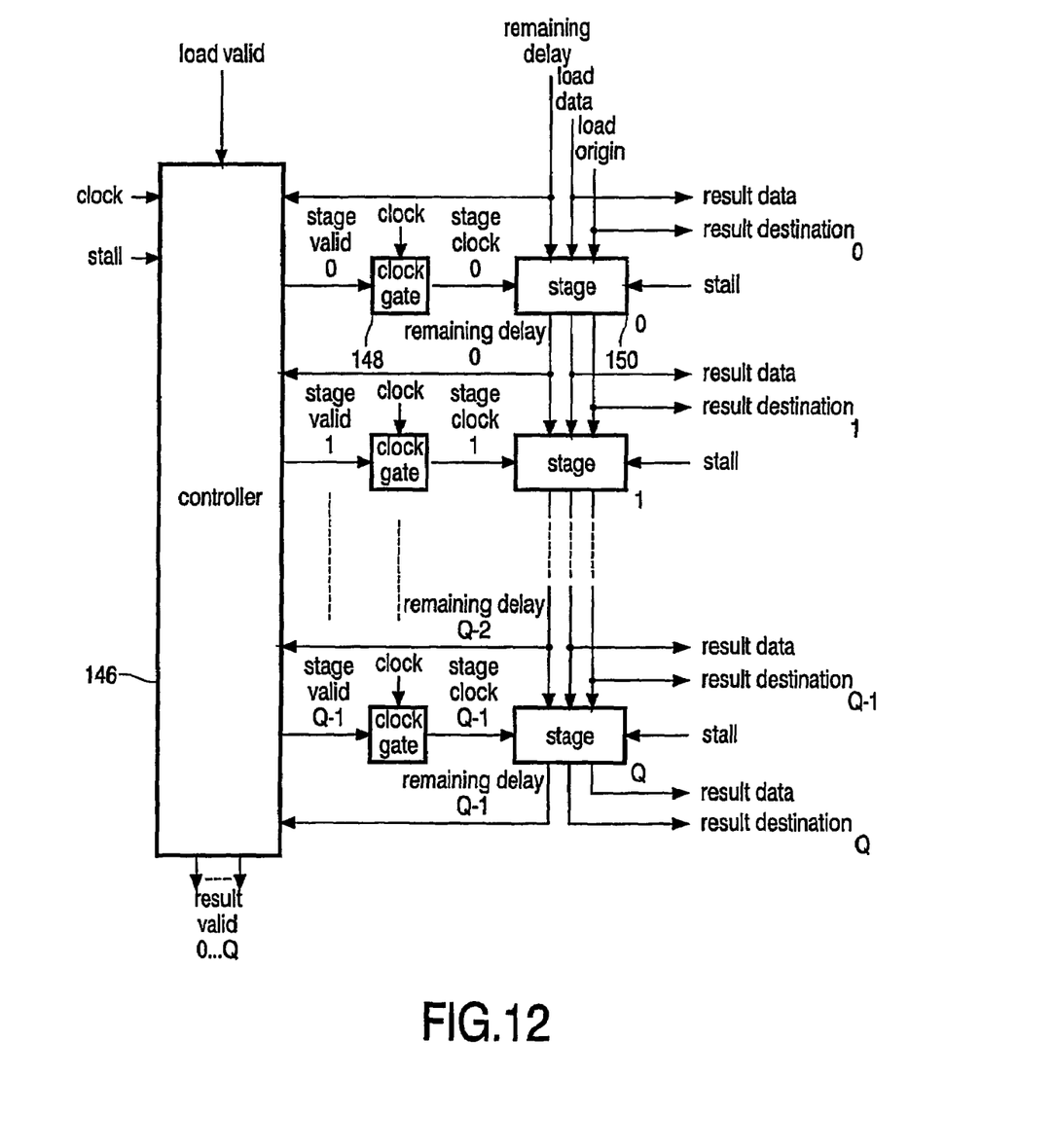
FIG. 12, a result queue embodiment.

FIG. 12 illustrates a result queue embodiment, here consisting of a single controller 146 and a plurality of stages like stage 150, the number of these stages is a function of the slack, the memory latency times and the number of load/store units minus 1. The number of stages is approximately equal to MAX (S, L*(LSU−1). The controller is clocked by the master clock and therefore, always active. It produces S stage valid flags that control S clock gates like clock gate 148, one for every stage. As a result, the stage is only active when it stores valid data, again for diminishing the level of power consumption.

A result queue will collect and buffer the data and other informations coming out of its corresponding SRAM and out of the intermediate queue to perform the final synchronization with the processor core. The signals load valid, load data, load/store unit identifier, and remaining delay will successively enter the queue in stage 150 at its top as shown. Once in the queue, the result as loaded undergoes its final delay. Once the remaining delay of a result reaches the value zero, the result is issued as a valid result at one of the stage outputs of the relevant queue. Multiple results that are intended for respective different load/store units can leave the queue in parallel.

Figure 13:
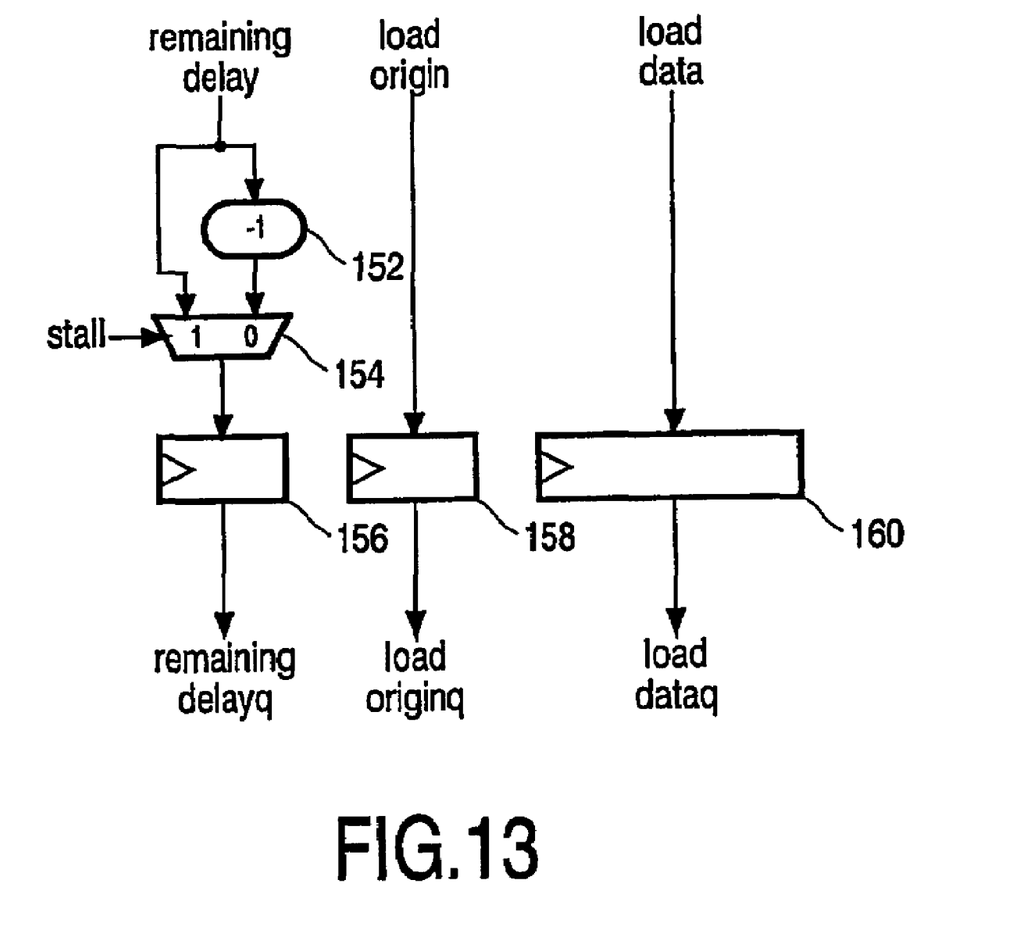
FIG. 13, a result queue stage.

FIG. 13 illustrates a result queue stage embodiment that consists of three registers that respectively hold the remaining delay value (register 156), the data (register 160), and the load/store unit identifier of a load operation (register 158). All stages taken together constitute a shift register. In normal operation, the remaining delay value is decremented in each stage (element 152), so that with the traversing of successive stages the remaining delay will eventually reach zero, to indicate that the total load/store latency has been attained. At that instant, the result may be sent back to the load/store unit. If a conflict occurs in memory that leads to a processor stall, the processor cycle time will be standing still. To keep the remaining delay value synchronized with the processor cycle time count, the remaining delay value is kept constant in this case through circumventing decrementer stage 152 and appropriate control of selector 154.

Figure 14:
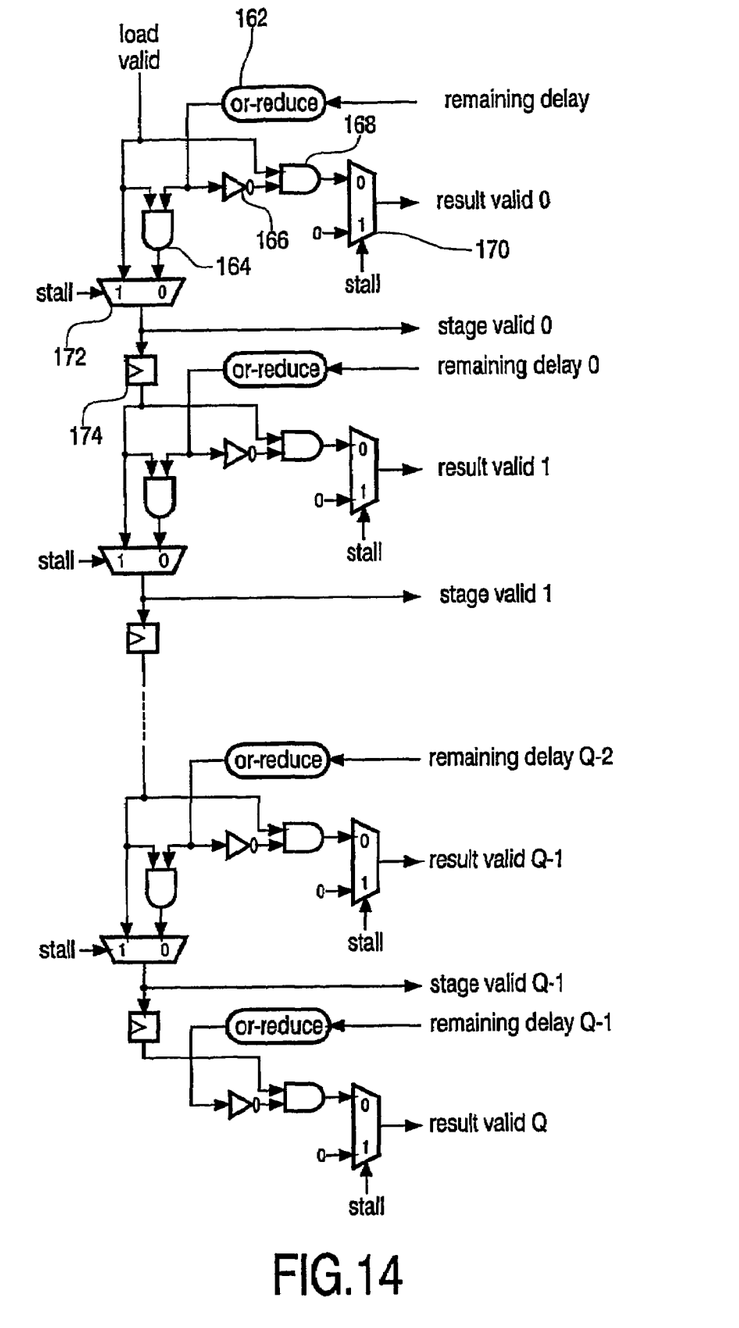
FIG. 14, a result queue controller embodiment.

FIG. 14 illustrates a result queue controller embodiment, thereby realizing a delay line for producing stage valid flags for the clock gates that control the various stages. At every stage in the delay line, the remaining delay value is examined. Once this value attains zero, the stage valid flag in this stage is cleared. Note also that if the processor is stalled by a memory conflict, no result can be sent back, since no load/store unit will be able to receive it. Therefore, in this case the result valid flags are cleared. Each stage in this controller comprises the following items, that are referred by number only in the first stage. First, the remaining delay value is entered into decrementing element 162. The output thereof, which equals the ORed value of all bits of the delay value, is fed to AND gate 164, together with the load valid signal in a serial arrangement across all stages. The output of the AND gate is fed to a selector 172 that is controlled by the stall signal. The output of the selector is latched in element 174, and thereupon fed to the next serial stage. Furthermore, the reducing element output is inverted in item 166, and likewise ANDED with the load valid signal in AND gate 168. The output value of this gate is fed to selector 170 which furthermore receives a "0" signal and which is controlled by the stall signal. The output signal of the selector 170 may yield the result valid 0 signal. The difference in the ultimate stage relates to the leaving out of items 164, 172 and associated wiring.

Figure 15:
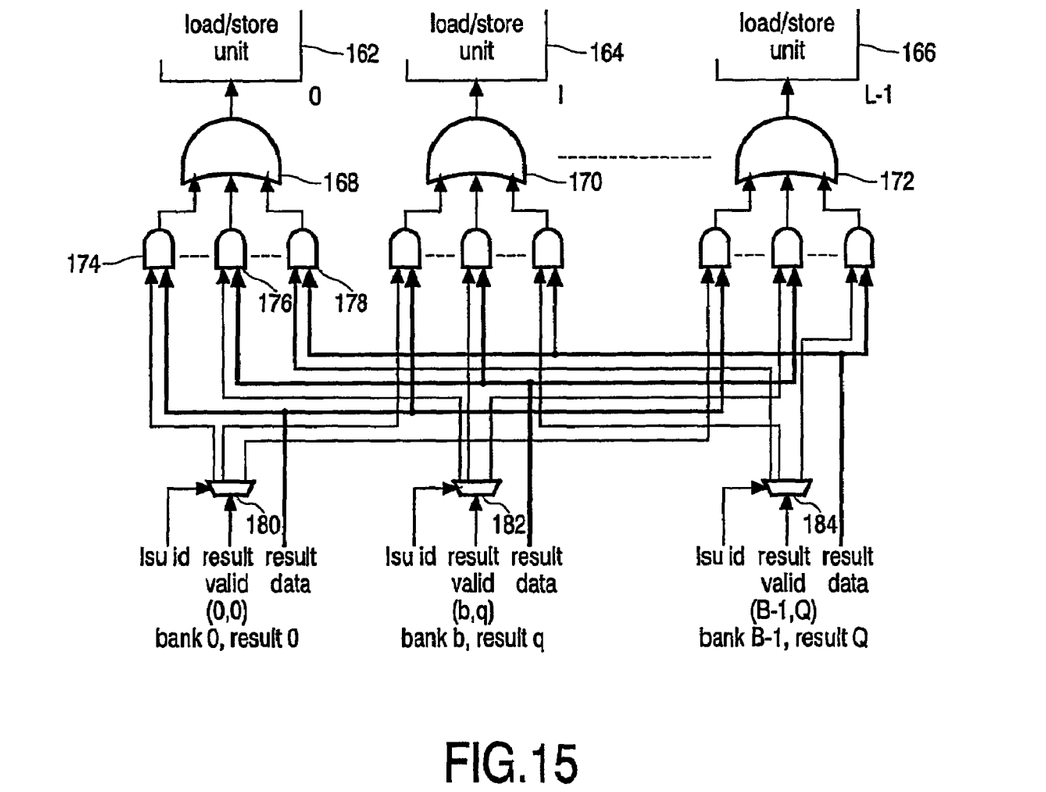
FIG. 15, a result router embodiment.

FIG. 15 illustrates a result router embodiment. This router executes sending the valid results that leave the result queue, back to the load/store units 162-164 from which the relevant requests did originate. The load/store unit id is used to determine the target load/store unit. A demultiplexer 180-184 selects the proper load/store unit whereto a valid flag should be sent. Since it is certain that in each cycle at most one valid request is sent back to a particular load/store unit, the result data to be sent back are determined by first bit-wise ANDING all result data with their corresponding result flag in two-input AND gates like 174-178, and next ORING them in OR gates 168-172 for each particular router.

The invention claimed is:

1. A computer memory arrangement, comprising a first plurality of input port facilities that are collectively coupled through a first router facility to selectively feed a second plurality of memory modules, and furthermore comprising an output port facility that is fed collectively by said second plurality of memory modules, said computer memory arrangement comprising an access detection facility for detecting simultaneous and conflicting accesses occurring through more than one of said first plurality of input port facilities for a particular memory module, and for thereupon allowing only a single one among said simultaneous and conflicting accesses while generating a stall signal for signaling a mandatory stall signal to any request source pertaining to another request, and a respective arbiter for upon finding plural concurrent access requests for access to an associated memory bank, generating an arbitrage signal that singles out a particular one of said concurrent access requests for exclusive handling thereof in preference to further access requests, and queueing said further access requests in the request queue in question, while said signaling said stall signal exclusively under control of an ORED full signalization of said request queue.

2. The computer memory arrangement of claim 1, wherein said stall signal issues for all input port facilities in parallel.

3. The computer memory arrangement of claim 1, wherein said output port facility further comprises a third plurality of output ports that are fed through a second router facility by said second plurality of memory modules.

4. The computer memory arrangement of claim 3, wherein at least one of said first plurality of input port facilities and said third plurality of output ports is greater than two.

5. The computer memory arrangement of claim 3, wherein said first plurality of input ports equals said third plurality of output ports, and each of said input port facility is associated to a respectively corresponding output port facility, and thereby to a respectively corresponding data source and sink.

6. The computer memory arrangement comprising a fourth plurality of load/store units interfaced to the computer memory arrangement of claim 3, wherein said at least one of said first plurality of input port facilities and at least one of said fourth plurality of load/store units are equal.

7. The computer memory arrangement of claim 1, wherein the computer memory arrangement is on a unified memory map.

8. A computer memory arrangement, comprising a first plurality of input port facilities that are collectively coupled through a first router facility to selectively feed a second plurality of memory modules, and furthermore comprising an output port facility that is fed collectively by said second plurality of memory modules, said computer memory arrangement comprising an access detection facility for detecting simultaneous and conflicting accesses occurring through more than one of said first plurality of input port facilities for a particular memory module, and for thereupon allowing only a single one among said simultaneous and conflicting accesses while generating a stall signal for signaling a mandatory stall signal to any request source pertaining to another request, and said computer memory arrangement comprising request queues each coupling an associated corresponding input port facility to said first router for providing an additional slack interval, and each one of said plurality of memory modules comprising a respective memory bank, and a respective arbiter for upon finding plural concurrent access requests for access to an associated memory bank, generating an arbitrage signal that singles out a particular one of said concurrent access requests for exclusive handling thereof in preference to further access requests, and queueing said further access requests in the request queue in question, while signaling said stall signal exclusively under control of an ORED full signalization of said request queue.

9. The computer memory arrangement of claim 8, wherein each of said second plurality of memory modules further comprises a respective result queue facility for transient storage of a result quantity read out from the respective memory bank.

10. The computer memory arrangement as claimed in claim 9, further comprising a uniform delay value through the combination of a request queue and a respective result queue.

11. The computer memory arrangement of claim 8, wherein said memory module further comprises an intermediate queue facility coupled across the input/output channel of the memory bank for storing acknowledge indicators for a pipelined memory operated at a clock frequency slower than that of a system clock.

12. The computer memory arrangement of claim 11, wherein said acknowledge indicators identify the request source of the associated request that is being served.

13. The computer memory arrangement of claim 8, wherein said request queues operate on a serial in parallel out arrangement and on a seniority precedence.

14. A method of detecting simultaneous and conflicting accesses, the method comprising acts of:
coupling collectively a first plurality of input port facilities through a first router facility to feed selectively a first plurality of memory modules
coupling an output port facility to said first plurality of memory modules;
detecting simultaneous and conflicting accesses occurring through more than one of said first plurality of input port facilities for a particular memory module;
allowing only a single one among said simultaneous and conflicting accesses while generating a stall signal for signaling a mandatory stall signal to any request source pertaining to another request, and
queueing said further access requests in the request queue in question, while signaling said stall signal exclusively under control of an ORED full signalization of said request queue.

15. The method of claim 14, comprising an act of:
generating an arbitrage signal that singles out a particular one of said concurrent access requests for exclusive handling thereof in preference to further access requests.

16. A method of detecting simultaneous and conflicting accesses, the method comprising acts of:
coupling collectively a first plurality of input port facilities through a first router facility to feed selectively a first plurality of memory modules;
coupling an output port facility to said first plurality of memory modules;
detecting simultaneous and conflicting accesses occurring through more than one of said first plurality of input port facilities for a particular memory module;
allowing only a single one among said simultaneous and conflicting accesses while generating a stall signal for signaling a mandatory stall signal to any request source pertaining to another request;
coupling an associated corresponding input port facility to said first router with request queues for providing an additional slack interval;
generating an arbitrage signal that singles out a particular one of said concurrent access requests for exclusive handling thereof in preference to further access requests; and
queuing said further access requests while signaling said stall signal exclusively under control of an ORED full signalization of said request queue.

* * * * *